United States Patent
Bates et al.

(10) Patent No.: US 6,200,373 B1
(45) Date of Patent: Mar. 13, 2001

(54) METHOD FOR CONTROLLING OF CERTAIN SECOND PHASES IN ALUMINUM NITRIDE

(75) Inventors: Richard A. Bates, Wappingers Falls, NY (US); Carla N. Cordero, Essex Junction, VT (US); Benjamin V. Fasano, New Windsor, NY (US); David B. Goland, Sopot (PL); Robert Hannon, Wappingers Falls, NY (US); Lester W. Herron, Hopewell Junction, NY (US); Gregory M. Johnson; Andrew Reitter, both of Poughkeepsie, NY (US); Subhash L. Shinde, Cortland Manor, NY (US); Lisa Studzinski, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/311,811

(22) Filed: May 13, 1999

Related U.S. Application Data

(62) Division of application No. 08/887,375, filed on Jul. 2, 1997, now Pat. No. 6,004,624.

(51) Int. Cl.[7] ................................................. B32B 17/00
(52) U.S. Cl. ........................... 106/98.5; 252/512; 252/515
(58) Field of Search .................................... 106/501, 98.5; 428/901, 469, 477; 252/512, 515

(56) References Cited

U.S. PATENT DOCUMENTS

| | | |
|---|---|---|
| 4,397,800 | 8/1983 | Suzuki et al. . |
| 4,770,953 | 9/1988 | Horiguchi et al. . |
| 4,886,709 | 12/1989 | Sasame et al. . |
| 5,290,375 | 3/1994 | Nagasaka et al. . |
| 5,292,552 * | 3/1994 | Yamakawa et al. .................. 427/229 |
| 5,370,907 | 12/1994 | Yamakawa et al. . |
| 5,424,261 | 6/1995 | Harris et al. . |
| 5,482,903 | 1/1996 | Duncombe et al. . |
| 5,552,107 | 9/1996 | Casey et al. . |
| 5,804,289 * | 9/1998 | Wakamatsu ........................... 428/212 |

* cited by examiner

*Primary Examiner*—Timothy M. Speer
(74) *Attorney, Agent, or Firm*—DeLio & Peterson LLC; Peter W. Peterson; Aziz M. Ahsan

(57) ABSTRACT

Electronic packages made with a high area percent coverage of blanket metal may be prone to certain kinds of ceramic defects. In aluminum nitride, these defects may be related to decomposition of the liquid sintering aid. In this experiment, unique additions to the metallization prevented the formation of certain ceramic defects. Our approach involves a unique composition used in an existing process.

9 Claims, 2 Drawing Sheets

METHOD FOR CONTROLLING OF CERTAIN SECOND PHASES IN ALUMINUM NITRIDE

This is a divisional of application Ser. No. 08/887,375 filed on Jul. 2, 1997 now U.S. Pat. No. 6,004,624.

BACKGROUND OF THE INVENTION

1. Field of the Invention

The present invention relates to densified ceramic bodies for electronic components and, in particular, to a densified ceramic body which is relatively free of surface defects.

2. Description of Related Art

Aluminum nitride (AlN) is of great interest as a material for electronic packages because of its high thermal conductivity and close match in thermal expansion to silicon. AlN can be densified at relatively low temperatures (1500–1700° C.) by additions of various low-melting-temperature compounds. Because of its high equilibrium vapor pressure, densification of the AiN ceramic can only be accomplished by hot pressing or liquid phase sintering.

Electronic packages using AlN as a dielectric are typically processed from ceramic tape or greensheets. Greensheets consist of aluminum nitride powder, sintering aids, and an organic binder. The electrical conductor in the package is formulated into a paste made of refractory metal powder, ceramic additives, and organic binder. These two components are used in the process illustrated in FIGS. 1A–1D. The paste 12, 14 is screened essentially in a blanket pattern on the top sheet 16 of the greensheet stack 10, as illustrated in FIG. 1A, where up to 80% of the surface of the greensheet may be covered by the paste. Often, two different pastes are deposited, one on top of the other. One paste may be added to provide adhesion to the ceramic and another to offer a surface which has sufficient exposed metal to allow plating. Greensheets are provided with through holes called vias which are also filled with conductive paste. The sheets 16 are then laminated by applying sufficient heat and pressure and the result is illustrated in FIG. 1B. The laminated stack 18 is then heated to remove the organic binder from the paste 12,14 and from the greensheet 16. Further heating sinters the powders of both the paste and the greensheet. The resulting stack is illustrated in FIG. 1C. In the sinter cycle, the sintering aids form a liquid which further aids densification of the ceramic body 20. If any component of the liquid sintering aids has a high vapor pressure, the liquid phase will tend to wick to the surface(s) of the part. The surface of the part may then tend to have an accumulation of sintering aid byproducts. The byproducts may be in the form of particles 22 which protrude above the surface as illustrated in FIG. 1D. The protruding particles 22 are especially undesirable on the surface of an electronic chip carrier because the particles present a debris hazard in clean room operations and may also damage a chip during the chip attach process. The chip damage problem is especially exaggerated when the metal covers a high area percent of the ceramic.

Processing of electronic packages is greatly aided by use of a multilayer ceramic (MLC) technology, in which greensheets are cast using AlN and metallization is applied in the form of thixotropic ink or paste. The ink typically contains a solvent, a metal powder, a binder, and ceramic additives. The particle size of the metal powder and the volume fraction of the ceramic additives are chosen in order to assure a shrinkage match between the metallization and the ceramic. The ceramic additives are typically similar to that of the powder mixture in the greensheet. In cases where there is a surface metal feature to which IO devices (wire bonds, pins, tape automated bonding (TAB), etc.) will be attached, mechanical adhesion between the metal and the ceramic is required. Here, ceramic additives to the ink are also of great value, in that they may provide an interlocking feature between the ceramic and metal.

In some electronic packaging applications, however, there is a need for coverage of much of the surface of the ceramic with metallization. It is possible for 70% or more of the ceramic surface to be taken up by metal features. The specifications for the surfaces of these packages have very stringent limits on the height of bumps or bulges in the ceramic, in order to prevent damage to die which are later attached to the packages. There is also a strong desire to limit the potential for the ceramic to be a source of particulate contamination in a clean room environment.

In a package with high surface metal loading, however, a problem with the sintering aid may occur. The sintering aid may have a tendency to move toward the surface during the sinter cycle. Since a highly loaded system will have few areas which are not covered by metallization, the liquid phase may accumulate in these areas. Furthermore, the liquid phase is likely to decompose into phases which are of a high hardness. This decomposed phase may cause an electronic package to violate specifications for surface defect height or to cause concerns about clean room contamination. In some extreme cases, the surface second phase may cause bulges in the metallization.

Accordingly, it is highly desirable to develop aluminum nitride bodies with minimal surface defects.

Bearing in mind the problems and deficiencies of the prior art, it is therefore an object of the present invention to provide a ceramic surface for an electronic component whereby the surface is substantially free of surface defects.

It is another object of the present invention to provide an aluminum nitride body with minimal surface defects.

A further object of the invention is to provide a method of producing a ceramic body which is substantially free of surface defects.

It is yet another object of the present invention to provide a method of producing an aluminum nitride body with minimal surface defects.

Still other objects and advantages of the invention will in part be obvious and will in part be apparent from the specification.

SUMMARY OF THE INVENTION

The above and other objects, which will be apparent to those skilled in the art, are achieved by the present invention which in a first aspect relates to a ceramic substrate with a depletion zone. The sintered aluminum nitride body comprises a substrate of aluminum nitride having a microstructure containing a compound of aluminum oxide and calcium oxide. The substrate has on at least a portion of a surface thereof a layer comprising a sintered mixture of a refractory metal, a binder, and tricalcium aluminate, such that a yttrium aluminate compound precipitate in the substrate is uniformly throughout the microstructure of the substrate except in the portion of the substrate adjacent to the layer wherein the microstructure of the substrate is depleted of the compound.

In another aspect, the present invention relates to a method of making the substrate with a depletion zone. The method for reducing formation of particles in surface and subsurface microstructures of aluminum nitride bodies comprises the steps of: a) providing a greensheet comprising aluminum nitride powder, a sintering aid and a binder; b) providing a paste comprising a refractory metal powder, a binder and a compound selected from the group consisting of tricalcium aluminate or other phases in the calcia-alumina system; c) applying the paste to at least a portion of a surface of the greensheet; and d) heating the greensheet and paste for a time and temperature sufficient to sinter the greensheet and paste.

In another aspect, the present invention relates to a paste composition for application to a greensheet for aluminum nitride bodies containing compounds from the calcia-alumina system. The paste application reduces formation of particles in surface and subsurface microstructures thereof comprising a refractory metal powder, a binder and a compound selected from the group consisting of tricalcium aluminate or the phases of the calcia-alumina system.

The preferred embodiments are as follows. Where tricalcium aluminate is the additive, it is added in a range of from about 1 to about 35 percent by volume of the paste, with 22 percent by volume being preferred.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
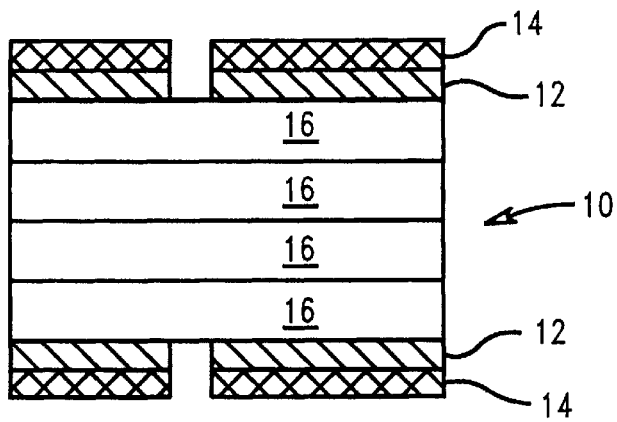
FIGS. 1A B, C, D illustrate the prior art metallization process and the resulting ceramic with second phase particles in the surface of the ceramic.
Figure 1B:
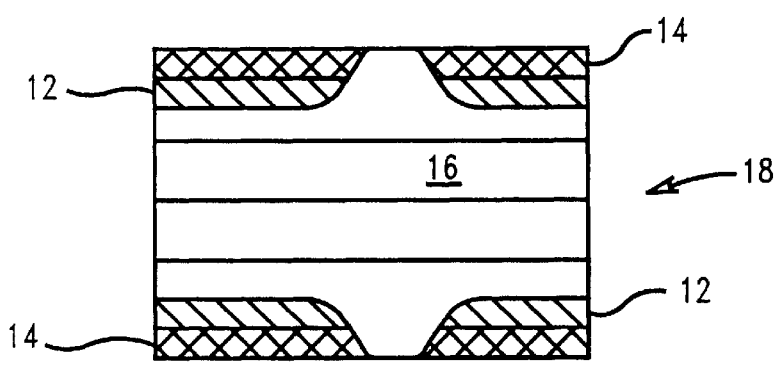
Figure 1C:
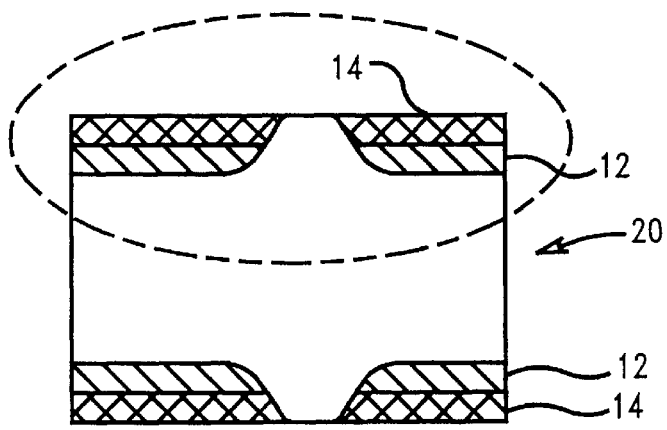
Figure 1D:
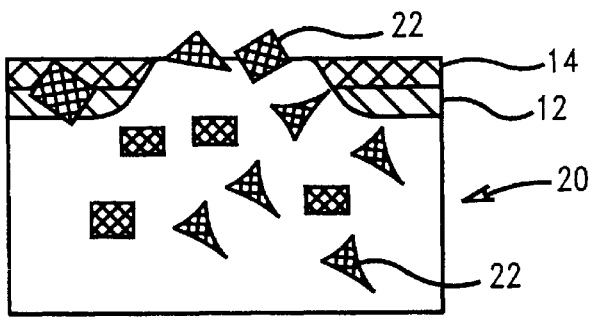

In describing the preferred embodiment of the present invention, reference will be made herein to FIGS. 2A–D of the drawings in which like numerals refer to like features of the invention. Features of the invention are not necessarily shown to scale in the drawings.

The metal paste of the present invention comprises a refractory metal powder such as tungsten, a binder such as ethyl cellulose, and sintering aid compounds.

The addition of sintering aid compounds (to be described more fully below) to surface metallization paste has been found to be effective in overcoming the surface defect problems described above. These additives have been determined to help prevent the formation of surface defects by the creation of a depletion zone, near the surface of the ceramic, which is free of precipitated second phase particles. The additive compounds are of the calcia-alumina system.

Various sintering aids and compounds were added to metallization pastes, such as tungsten pastes, at various volume percents. Total ceramic additives may range from 5 to 65 volume percent of the non-organic portion of the paste, with 55 volume percent being preferred. These additives included aluminum nitride (AlN), and ceramic sintering aid compounds such as aluminum oxide ($Al_2O_3$), tricalcium aluminate or C3A ($3CaO*Al_2O_3$), a calcium aluminoborate glass and compounds in the calcium alumina system including CaO, $Ca_3O$, $Ca_3Al_2O_6$, $Ca_{12}Al_{14}O_{33}$, $CaAl_2O_4$, $CaAl_4O_7$, $CaAl_{12}O_{19}$, and $Al_2O_3$. The composition of calcium aluminoborate is disclosed in U.S. Pat. No. 5,482,903 which is hereby incorporated by reference. Where tricalcium aluminate is the additive, it is added in a range of from about 1 to about 35 percent by volume, with 22 percent by volume being preferred. Aluminum nitride powder may also be added to the paste in addition to the ceramic sintering aids in an amount from about 1 to about 50 volume percent of the paste.

The method for reducing formation of particles in surface and subsurface microstructures of aluminum nitride bodies is illustrated in FIGS. 2A–D and comprises the steps of providing a greensheet comprising aluminum nitride powder, a sintering aid and a binder; providing a paste comprising a refractory metal powder, a binder and a compound selected from the group consisting of tricalcium aluminate and aluminum nitride powder; applying the paste to at least a portion of a surface of the greensheet; heating the greensheet and paste for a time and temperature sufficient to sinter the greensheet and paste.

Figure 2A:
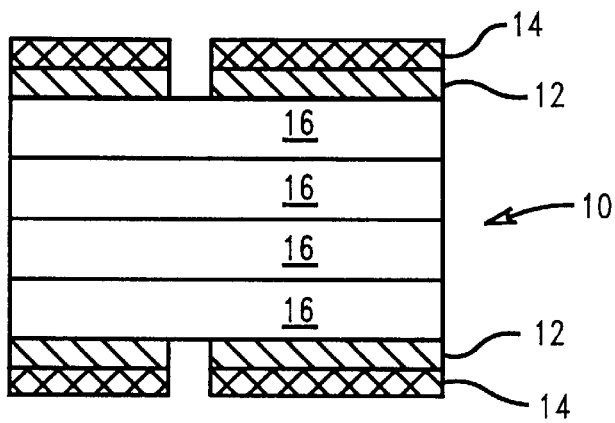
FIG. 2A is an illustration of a stack of greensheets screened with first and second layers of metal paste.
Figure 2B:
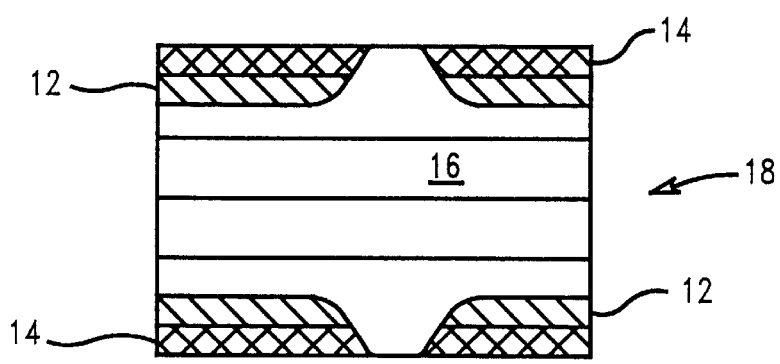
FIG. 2B is an illustration of the screened stack of FIG. 1 after lamination.
Figure 2C:
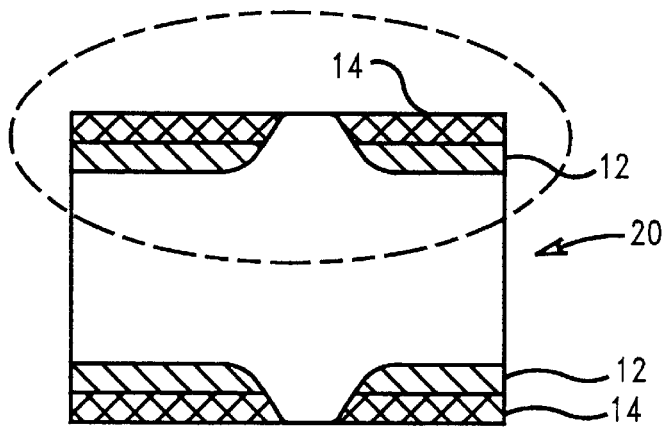
FIG. 2C is an illustration of the laminated stack of FIG. 2 after binder burnoff and sintering.
Figure 2D:
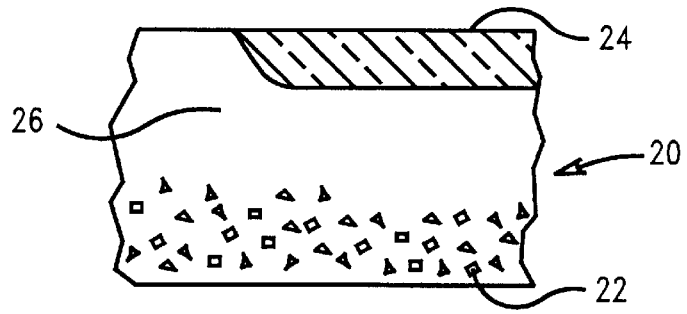
FIG. 2D is a greatly enlarged illustration of the circled area of FIG. 2C illustrating a ceramic body with a depleted zone which is free of second phase particles.

In the first step illustrated in FIG. 2A, first and second layers 12,14 of metal paste are applied to green sheets 16 which are placed one on top of another in the stack 10. Next, as illustrated in FIG. 2B, a lamination process is performed and a laminated stack 18 is produced. The sintering step follows and produces the densified ceramic 20 of FIG. 2C. FIG. 2D illustrates a greatly enlarged encircled section of FIG. 2C with a metalized 24 layer and a depletion zone 26.

Metal paste may be applied in one or two layers in accordance with the present invention. Where the paste is applied in only one layer the paste may comprise aluminum nitride and tricalcium aluminate in a range from about 1 to 35 percent by volume.

Where a two layer method is used, the second layer may have a greater concentration of tungsten. The first layer may comprise tricalcium aluminate in a range of from about 1 to about 35 percent by volume of the paste. The second layer may comprise aluminum nitride or a compound which does not react with the ceramic, or no additive at all (pure tungsten).

The product produced by the above methods has been found to have a unique microstructure in AlN ceramic containing yttrium aluminates, whereby there is localized control of microstructure and phases which result in a zone of from 10 microns to 200 microns deep into the part underneath surface screened or I/O metallization. The depleted zone is substantially free of precipitated yttrium aluminates but may contain a wetted phase.

EXAMPLE

In tests, the results of which are described in Table 1, pastes were blanket screened providing at least 80% coverage of the greensheet. The metalization was deposited in either one or two layers. The screened sheets were stacked and laminated at 6000 psi at 75° C. for 5 minutes and then the laminated parts were sintered at 1600° C. for 24 hours.

The parts were then examined in cross section for evidence of a depletion zone. Four pieces were mounted and a photograph at approximately 200× magnification was taken in a scanning electron microscope (SEM) under conditions which would highlight the yttrium aluminate particles. On each photo, the width of the depletion zone on each side was measured.

It is important to note that the aluminum nitride ceramic contains sintering aids of approximately 2% by volume calcium aluminoborate (CAB) glass and approximately 1% by volume $Y_2O_3$. Also, other tests yielded similar results when only one paste layer with similar components was screened.

TABLE 1

| Test No. | First Layer Paste Additives* | Second Layer Paste Additives | Minimum zone width, microns | Average zone width, microns | Maximum zone width, microns |
|---|---|---|---|---|---|
| 1 | 55% AlN | 100% tungsten | 0 | 0 | 0 |
| 2 | 28% AlN, 7% C3A | no second layer | 24 | 32 | 41 |
| 3 | 21% AlN, 14% C3A | no second layer | 53 | 69 | 82 |
| 4 | 44% AlN, 11% C3A | no second layer | 59 | 61 | 65 |
| 5 | 33% AlN, 22% C3A | no second layer | 106 | 115 | 123 |
| 6 | 28% AlN, 7% C3A | 100% tungsten | 24 | 32 | 47 |
| 7 | 21% AlN, 14% C3A | 100% tungsten | 12 | 57 | 88 |
| 8 | 44% AlN, 11% C3A | 100% tungsten | 24 | 41 | 82 |
| 9 | 33% AlN, 22% C3A | 100% tungsten | 59 | 115 | 206 |

*C3A is an abbreviation for tricalcium aluminate or
*$Al_2O_3$.

The test results illustrate that it is possible to control the microstructure of the ceramic directly under the surface metalization by unique additions to the metallization paste layer. Additions of tricalcium aluminate or similar compounds of the calcia-alumina system are shown to greatly reduce the amount of sintering aid byproduct on the surface after sintering. Typical manufacturing of ceramic packages with blanket metallization requires plateability and a high degree of adhesion to the ceramic. The approach of the present invention addresses these concerns.

It should also be noted that the present invention has a unique fingerprint, a zone in the ceramic which is free of second phase particles. The zone starts at the metallization and extends down into the ceramic for some 5 to 100 microns in depth.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A paste composition for application to an unsintered greensheet for aluminum nitride bodies containing compounds from the calcia-alumina system comprising a refractory metal powder, a binder and tricalcium aluminate, said paste adapted to reduce formation of particles in surface and subsurface microstructures thereof by forming a depletion zone substantially free of second phase particles formed during sintering of said paste in combination with said unsintered greensheet.

2. The paste of claim 1 wherein the tricalcium aluminate is present in an amount of about 1 to about 35 volume percent.

3. The paste of claim 1 wherein application of said paste on a surface of a greensheet creates said depletion zone having a thickness of about 10 to about 200 microns upon sintering said paste and said greensheet from a surface of said sintered paste and greensheet.

4. A paste composition for application to an unsintered greensheet for aluminum nitride bodies containing compounds from the calcia-alumina system comprising a refractory metal powder, a binder and a compound selected from the group consisting of $3CaO.Al_2O_3$, $Ca_3Al_2O_6$, $Ca_{12}Al_{14}O_{33}$, $CaAl_4O_7$, and $CaAl_{12}O_{19}$, said paste adapted to prevent formation of particles in surface and subsurface microstructures thereof by forming near a surface of said aluminum nitride bodies a depletion zone substantially free of second phase particles formed during, sintering, of said paste in combination with said unsintered greensheet.

5. The paste of claim 4 wherein application of said paste on a surface of said greensheet creates said depletion zone having a thickness of about 10 to about 200 microns upon sintering said paste and said greensheet from a surface of said sintered past and greensheet.

6. The paste of claim 1 wherein said refractory metal powder comprises tungsten.

7. The paste of claim 1 wherein said binder comprises ethyl cellulose.

8. The paste of claim 1 further comprising about 1 to about 50 volume percent of aluminum nitride.

9. The paste of claim 4 wherein said compound selected from the group consisting of $3CaO.Al_2O_3$, $Ca_3Al_2O_6$, $Ca_{12}Al_{14}O_{33}$, $CaAl_4O_7$, and $CaAl_{12}O_{19}$ is present in an amount of about 5 to about 65 volume percent.

* * * * *

UNITED STATES PATENT AND TRADEMARK OFFICE
CERTIFICATE OF CORRECTION

PATENT NO. : 6,200,373 B1
DATED : March 13, 2001
INVENTOR(S) : Richard A. Bates et al.

It is certified that error appears in the above-identified patent and that said Letters Patent is hereby corrected as shown below:

<u>Column 3,</u>
Line 32, after "1A" insert -- , --.

<u>Claims,</u>
<u>Claim 5, column 6,</u>
Line 39, delete "past" and substitute therefor -- paste --.

Signed and Sealed this

Thirtieth Day of October, 2001

Attest:

NICHOLAS P. GODICI
Attesting Officer
Acting Director of the United States Patent and Trademark Office